(12) United States Patent
Chiu et al.

(10) Patent No.: US 8,339,197 B2
(45) Date of Patent: Dec. 25, 2012

(54) CIRCUITRY INCLUDING MATCHED TRANSISTOR PAIRS

(75) Inventors: Kwok-Fu Chiu, San Jose, CA (US); Yih-Chyi Chong, Santa Clara, CA (US); Michael E. Haslam, Arlington, TX (US)

(73) Assignee: National Semiconductor Corporation, Santa Clara, CA (US)

( * ) Notice: Subject to any disclaimer, the term of this patent is extended or adjusted under 35 U.S.C. 154(b) by 16 days.

(21) Appl. No.: 12/959,319

(22) Filed: Dec. 2, 2010

(65) Prior Publication Data

US 2012/0139634 A1 Jun. 7, 2012

(51) Int. Cl.
*H03F 3/45* (2006.01)
(52) U.S. Cl. .......................... 330/252; 330/257
(58) Field of Classification Search .............. 330/252, 330/257; 257/565–576
See application file for complete search history.

(56) References Cited

U.S. PATENT DOCUMENTS

| | | | | |
|---|---|---|---|---|
| 5,374,897 A | * | 12/1994 | Moraveji | 330/252 |
| 5,682,120 A | * | 10/1997 | Ito | 330/252 |
| 6,181,202 B1 | * | 1/2001 | Yamasaki | 330/257 |

* cited by examiner

*Primary Examiner* — Khanh V Nguyen
(74) *Attorney, Agent, or Firm* — Wade J. Brady, III; Frederick J. Telecky, Jr.

(57) ABSTRACT

Matched bipolar transistor pairs for use in differential transistor pair circuitry, current mirror transistor pair circuitry and voltage reference transistor pair circuitry are disclosed. Each transistor in the pair includes a base, emitter and a collector region and a doped polysilicon emitter contact, a metal emitter contact and an metal emitter interconnect which makes an electrical connection to the emitter region by way of the metal emitter contact and the polysilicon emitter contact. The metal emitter interconnect is displaced latterly away from the emitter region so that no part of the metal emitter interconnect overlies any portion of the emitter region.

14 Claims, 7 Drawing Sheets

CIRCUITRY INCLUDING MATCHED TRANSISTOR PAIRS

BACKGROUND OF THE INVENTION

1. Field of the Invention

The present invention relates generally to transistor configurations and in particular to circuitry which includes matched bipolar transistor pairs.

2. Description of Related Art

Transistor matching is important for improved operation for many types of integrated circuits. Referring to the drawings, FIG. 1 shows circuitry which includes an ideal operational amplifier A. A non-ideal operational amplifier will posses a finite input offset voltage Vos which can be defined as the magnitude of the input voltage difference necessary to provide a zero output. The FIG. 1 circuit is a model illustrating the effect of input offset voltage Vos on an amplifier having a typical feedback network comprising Zi and Zf. The effect of Vos on the output voltage Vo for the FIG. 1 configuration is as follows:

$$Vo = Vos(Zf+Zi)/Zi \qquad \text{Eq (1)}.$$

Clearly there is an incentive to reduce the influence of the input offset voltage Vos since it results in an error in the output voltage Vo.

Amplifier A of FIG. 1 typically includes a differential input stage having differential inputs (−) and (+). FIG. 2A is a portion of a simplified differential input stage 22A which includes a differential transistor pair Q1 and Q2. The base electrodes of Q1 and Q2 form the respective differential inputs (+) and (−) of the amplifier, with the emitters of the pair being coupled to a common tail current source. Note that in some applications, emitter resistors $R_E$ can be made smaller or close to zero. The tail current source includes a transistor Q0 having a base connected to a bias voltage Vbias and an emitter connected to ground. The tail current source provides a relatively constant current output which is divided between Q1 and Q2, with the magnitude of the division depending upon the relative magnitudes that form the differential inputs (+) and (−). For large signal differential inputs it is possible that one transistor will be turned off and with the other transistor will be conducting the entire current from source transistor Q0. However, for small signal differential inputs, a differential current is produced in Q1 and Q2 relating to the differential input.

FIG. 2B is another differential input stage 22B which is electrically equivalent to the input stage of FIG. 2A assuming that the total current produced by QA and QB is the same as the current provided by Q0.

As used herein, the term "differential transistor pair circuitry" is defined to mean a pair of transistors arranged in a differential circuit configuration such that a small signal differential input applied between the transistor base electrodes results in a differential current flow in the transistors. By way of example, transistors Q1 and Q2 of FIG. 2A form differential transistor pair circuitry as do transistors Q1 and Q2 of FIG. 2B.

A major source of input offset voltage Vos for a typical operational amplifier is due to a mismatch between the differential input pair such a transistor pair Q1/Q2. When the input pair transistors are conducting equal currents, the base-emitter voltages $V_{BE}$ of the two transistors are ideally the same. Any differences in $V_{BE}$ voltage will result in a corresponding input offset voltage Vos for the associated amplifier.

Transistor mismatches are relevant to circuitry other than differential transistor pairs. FIG. 9A shows a typical current mirror circuit 24 made up of matched transistors Q3 and Q4. The term matched in this context means that for equal emitter current densities, two matched transistors will produce the same base-emitter voltages $V_{BE}$. As can be seen in FIG. 9A, the base electrodes of Q3 and Q4 are connected together as are the emitter electrodes (both connected to the circuit common). Transistor Q3, which is this example is connected like a diode will conduct a current based essentially upon the voltage dropped across resistor 26 which is equal to (+Vcc− $V_{BE}$)/R where R is the value of resistor 26. This current, which forms the input of the current mirror, will produce a resultant base-emitter voltage $V_{BE}$ across Q3 which will also be dropped across the base-emitter electrodes of Q4. Assuming that Q3 and Q4 have equal emitter areas, this base-emitter voltage will result in a current through Q4 which is equal to that in Q3. Frequently, the emitter areas of either Q3 or Q4 or both are adjusted to provide differing current mirror values. By way of example, if the emitter area of Q3 were twice that of Q4, Q4 would conduct twice the current of Q3. In order to provide a more precise emitter area ratio of two, transistor Q3 could be formed from two transistors similar to Q4, with the two transistors being connected in parallel so as to result in an effective single transistor having twice the emitter area of Q4.

Note that the above-described relationship between the two currents in the FIG. 9A current mirror circuit ignores various sources of errors. That includes errors which result from the fact that Q3 and Q4 may not have the same base-collector voltages (errors due to the Early effect) and the fact that both transistors draw base currents (the current gains are finite). However, variations of the FIG. 9A circuitry have been developed to address these sources of current mirror errors. Even if these sources of errors are addressed, the base-emitter regions of transistors Q3 and Q4 could still be mismatched such that equal base-emitter voltages $V_{BE}$ do not result in equal current densities. This, this mismatch will result in current mirror circuit errors in current magnitudes.

FIG. 9B shows another prior art current mirror circuit 25 similar to circuit 24 of FIG. 9A with transistor Q4A of FIG. 9B being the same as Q4. In this case, an additional transistor Q4B is added to the circuit, with Q4B typically being identical to Q4A so that Q4A and Q4B conduct the same current. However, mismatching between Q4A and Q4B can further result in differences in the current magnitudes of the two transistors.

As used herein, the term "current mirror transistor pair circuitry" is defined to mean a pair of transistors arranged in a current mirror configuration having a common base connection, separate collector connections and the same respective emitter current densities. By way of example, transistors Q3 and Q4 of FIG. 9A form current mirror transistor pair circuitry. As another example, transistors Q4A and Q4B of FIG. 9B also form current mirror transistor pair circuitry.

Still another circuit that can suffer from transistor mismatch is the prior art band-gap reference circuit such as depicted in FIG. 10A. As is well known, a band-gap reference circuit provides a temperature compensated reference voltage Vref. The circuit operates to combine two voltages having opposite temperature coefficients (tempcos) which are combined to provide a reference voltage with a near zero tempco. The base-emitter voltage $V_{BE}$ of a silicon transistor has a magnitude at room temperature of about 600 mV and a negative tempco of approximately −2 mV/° C. A difference in base-emitter voltages $\Delta V_{BE}$ which results from a difference in current density of 10 to 1 is about 60 mV, with this voltage having a positive tempco of approximately +0.085 mV/° C.

When these two voltage components are properly scaled and combined the desired low tempco reference voltage is produced.

Referring again to the FIG. 10A reference circuit, transistor Q5 is configured to operate at a higher current density than transistor Q6. This is typically achieved by making currents I1 and I2 equal to one another and forming Q6 to have an emitter area larger than that of Q5. Of course, the magnitudes of the currents can also be adjusted. If the emitter area ratio is 10 to 1 for example, the difference in base-emitter voltages $\Delta V_{BE}$ of Q5 and Q6 is about 60 mV at room temperature. That difference in voltage is dropped across resistor 34 which produces a current I2 in transistor Q6 also having a positive tempco. The ratio of resistors 34 and 36 provide a scaling factor of 1 to 10 so that the positive tempco voltage across resistor 36 is about 600 mV. The reference output voltage Vref is the sum of the base-emitter voltage $V_{BE}$ of Q7 and the $\Delta V_{BE}$ voltage dropped across resistor 36 to provide a total near zero tempco voltage of about 1.2 V. The accuracy of the FIG. 10A band-gap reference circuit over temperature is highly dependent upon the accurate matching of transistors Q5 and Q6 which produce the $\Delta V_{BE}$ term, other than ratio of resistances 36 and 38.

FIG. 10B depicts another band-gap reference circuit. Resistors 42 and 44 are usually the same value. Feedback operation of operational amplifier 46 functions to maintain the voltage levels at the amplifier inputs at the same magnitude so that currents I1 and I2 are equal. Transistor Q8 has an emitter area which is larger than that of Q9, with a ratio of 10 to 1 being typical. Thus, transistor Q8 has a base-emitter voltage which is about 60 mV less than the base-emitter voltage of Q9 so that a $\Delta V_{BE}$ term is dropped across resistor 48. The values of resistors 48 and 50 are selected to scale the 60 mV drop across resistor 48 to about 600 mV, with this voltage having a positive tempco. That voltage is added to the base-emitter voltage $V_{BE}$ of Q9 to provide a near zero tempco output reference voltage Vref of about 1.2 volts. Once again, the matching of transistors Q8 and Q9 is a major factor in the accuracy of Vref.

FIG. 10C shows a still further band-gap reference circuit which includes matched transistors Q10 and Q11. Transistor Q10 typically has an emitter area ratio with respect to transistor Q11 of 10 to 1. Once again, operational amplifier 58 operates to maintain through feedback equal voltages at the amplifier inputs so that the voltage drops across resistors 52 and 54 are equal. Assuming that the values of resistors 52 and 54 are equal, currents I1 and I2 provided to transistors Q10 and Q11 are also equal. Thus, the base-emitter voltage $V_{BE}$ of Q10 is about 60 mV less than that of Q11 so that a $\Delta V_{BE}$ of that value is dropped across resistor 56. The positive tempco voltage is scaled up to about 600 mV based upon the values of resistors 52 and 56. The negative tempco base-emitter voltage $V_{BE}$ of Q10 is added to the positive tempco voltage across resistors 52 and 56 to provide the near zero tempco output voltage Vref of 1.2 volts. Once again, the matching of transistors Q10 and Q11 is a major factor in the accuracy of voltage Vref.

As used herein, the term "voltage reference transistor pair circuitry" is defined to mean a pair of transistors arranged in a voltage reference configuration where the reference output is derived from the combination of a negative tempco component and a positive tempco component, with the positive tempco component being derived from a difference in base-emitter voltages of the transistor pair. By way of example, transistors Q5 and Q6 of FIG. 10A form voltage reference transistor pair circuitry as do transistors Q8 and Q9 of FIG. 10B and transistors Q10 and Q11 of FIG. 10C.

Although various techniques have been used to enhance the matching of the above-described differential, current mirror and voltage reference differential transistor pair circuitry, there is room for improvement as will be described in the following Detail Description of the Invention taken together with the drawings.

DETAILED DESCRIPTION OF THE INVENTION

Figure 1:
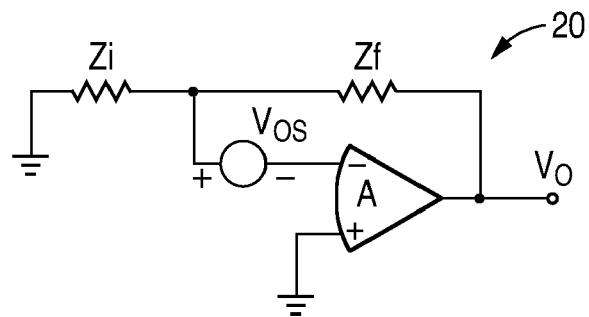
FIG. 1 depicts a prior art model which includes an ideal operational amplifier with exemplary feedback elements to illustrate the effect of amplifier input offset voltage Vos.
Figure 2A:
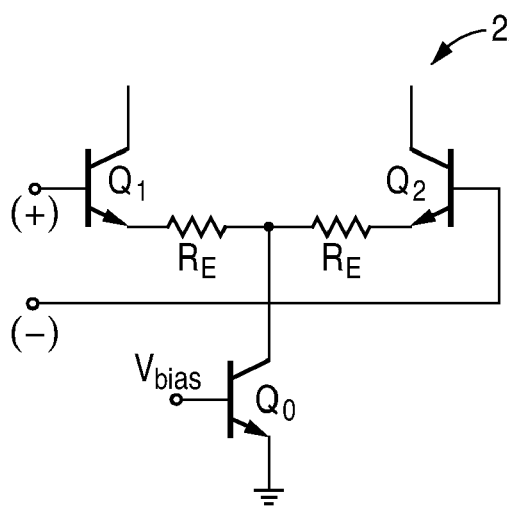
FIG. 2A is a simplified circuit diagram of a portion of a typical prior art differential amplifier input stage including input transistors arranged in a differential transistor pair configuration.
Figure 2B:
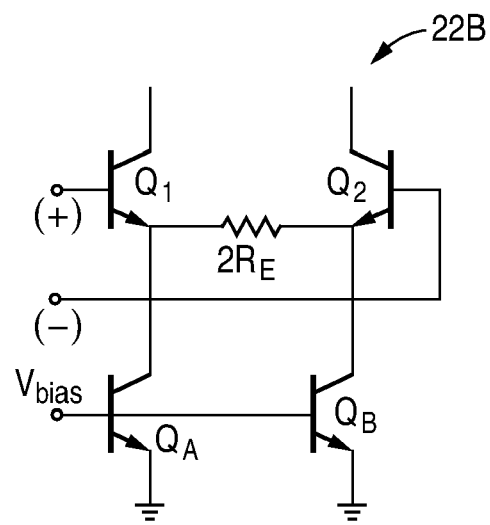
FIG. 2B is a simplifier circuit diagram of a portion of another typical prior art differential amplifier input stage including input transistors arranged in a differential transistor pair configuration.
Figure 4:
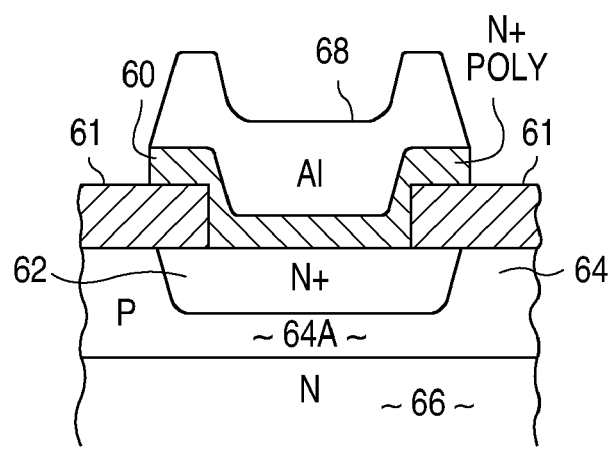
FIG. 4 is a side view of another prior art bipolar transistor.

Referring again to the drawings, FIG. 4 depicts a cross section of a conventional NPN transistor which utilized polysilicon emitter technology. The base and collector contacts are not depicted. Rather than using ion implantation to form the emitter region, the emitter is formed through outdiffusion of dopant from polysilicon (poly) which is in direct contact with the monocrystalline substrate. In the present case, N+ poly 60 is used which extends through an oxide 61 opening down to the substrate. The doped poly provides N type dopant to form the N+ type emitter region 62 in the P type base region. The width of the intrinsic base region 64A is defined by the depth of the diffused emitter region 62 relative to the N type collector region. A metal interconnect layer 68, typically aluminum, if formed on the conductive poly 60 and over the emitter 62 window formed in oxide 61 to provide electrical contact to the poly and emitter 62. Typically, the electrical connection between the metal interconnect layer and the poly is made by one or more metal contacts.

Figure 3:
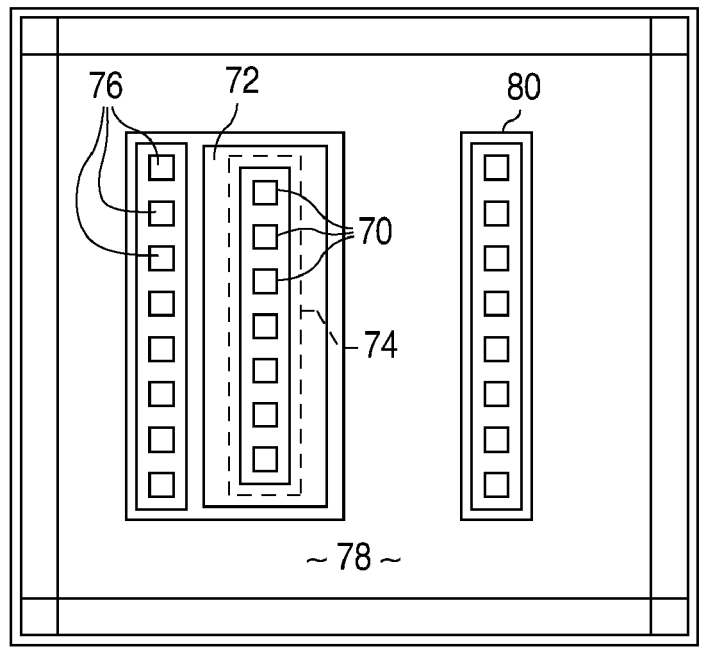
FIG. 3 is a plan view of a prior art bipolar transistor.

FIG. 3 is a plan view of another similar prior art poly emitter transistor showing the N+ poly 72 which extends down through an oxide window (not depicted). The dopant from the poly functions to form the N+ emitter region through an emitter window 74 depicted in phantom which is formed in the oxide. A plurality of spaced apart metal contacts 70, disposed directly over the emitter 74 window, electrically connect the poly 72 to the metal interconnects (not depicted in FIG. 3). A collector contact region 80 is disposed away from the emitter/base contact regions 70/76. The areas surrounding the emitter/base contact regions 70/76 are covered by a field oxide 78 as is the area intermediate those contacts and the collector contact region 80.

Figure 5:
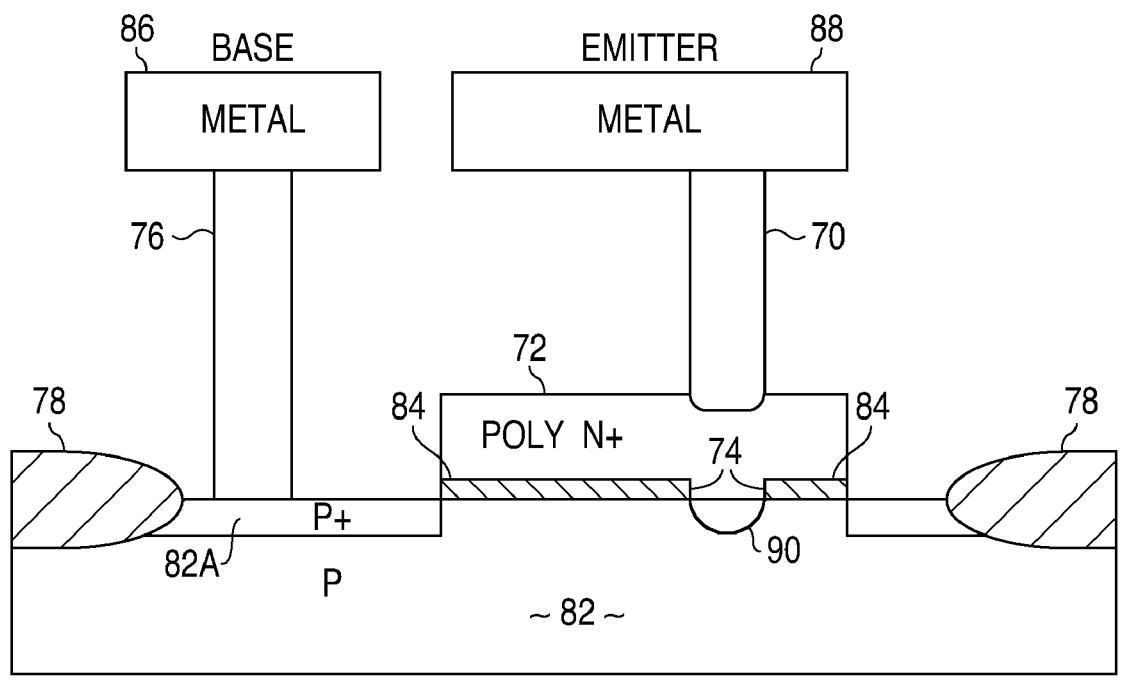
FIG. 5 is a schematic side view of a portion of a prior art bipolar transistor showing the base and emitter regions only.

FIG. 5 is a schematic representation of part of the FIG. 4 prior art transistor illustrating the relative positions of selected transistor components, with the collector elements not being depicted. A P+ contact region 82 is provided to form a contact for the base region 82. The contact region 82A is connected to a base electrode metal interconnect layer 86 by way of metal contacts 76. The N+ poly region 72 is disposed over an oxide layer 84, with the oxide layer defining the emitter window 74 through which the N+ dopants pass to form the N+ emitter region 90.

Emitter window 74 defines the periphery of the emitter region 90. As will be explained, it has been found that emitter metal interconnect 88 disposed over the emitter window 74 has an adverse effect on the properties of the transistor.

Figure 6:
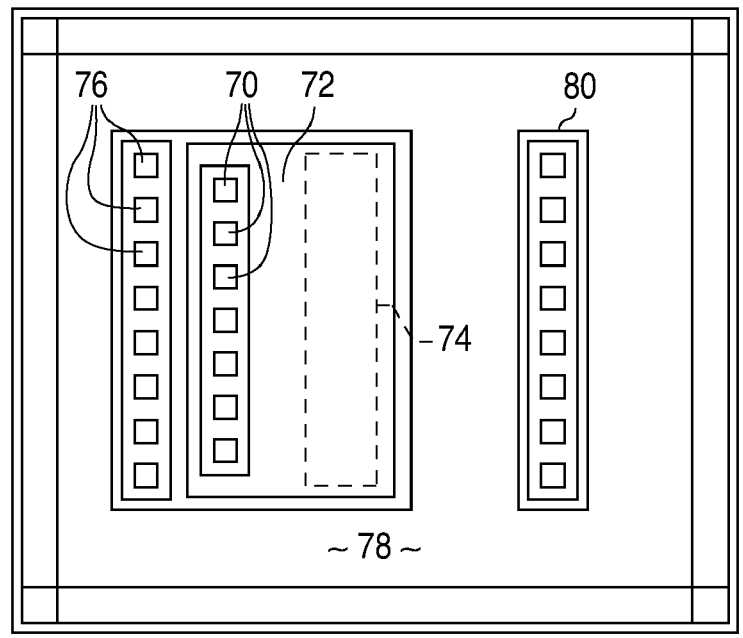
FIG. 6 is a plan view of a bipolar transistor with the metal emitter contacts located away from the emitter region.
Figure 7:
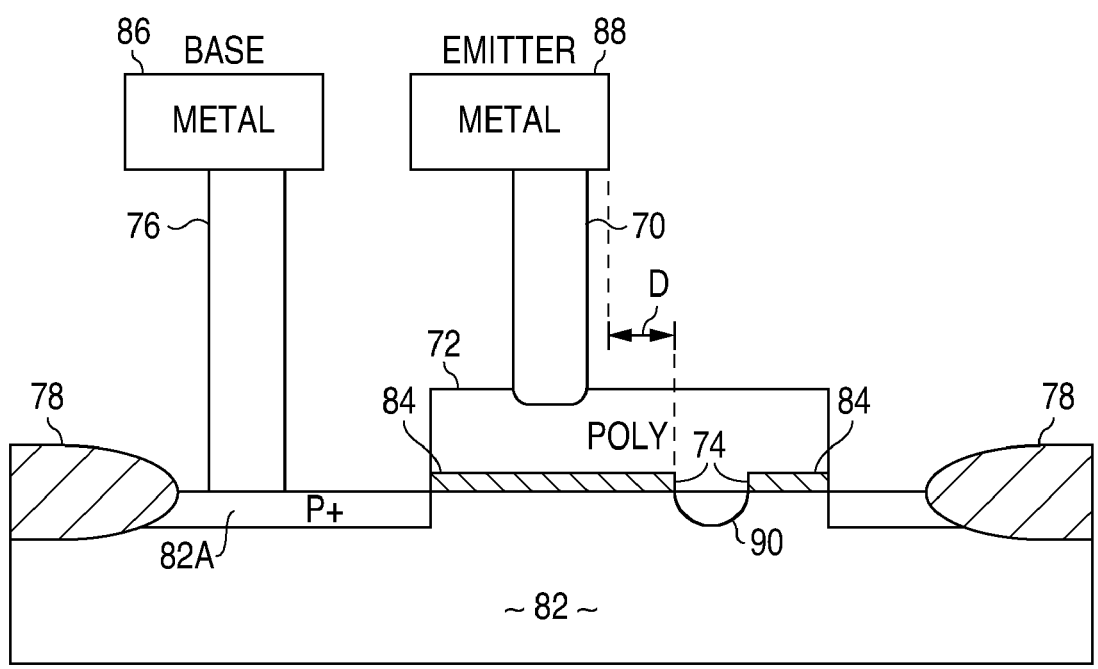
FIG. 7 is a side schematic view of a bipolar transistor showing the base and emitter regions only, with the metal emitter contact being displaced laterally away from the emitter region.

FIGS. 6 and 7 depict one embodiment of a transistor which can be used as part of a matched differential transistor pair, current mirror transistors or a voltage reference transistor pair circuitry (as previously defined) in accordance with various embodiments of the present invention. As can be seen in FIGS. 6 and 7, the transistor structure is similar to that of prior art FIG. 3 except that the metal emitter interconnect 88 is no longer disposed over the emitter window 74. Instead, the metal interconnect is disposed a distance D (FIG. 7) laterally away from the window. Thus, the electrical path from the metal contacts 70 to the emitter 90 located at the window 74 is provided by the N+ poly 72. Preferably, metal contact 70 is also disposed laterally away from the emitter window.

The placement of the metal emitter interconnect 88 over the region of the emitter window 74 is believed to place a stress on the relatively shallow thus sensitive emitter region 90, with that stress having an adverse affect on the electrical characteristics of the transistor. This is particularly true when the transistor has been subjected to repeated thermal cycling. The process of thermal cycling is believed to alter the stress characteristics of the transistor through the metal. Among other factors, this stress appears to be related to the differences in the coefficient of thermal expansion for silicon and polysilicon as compared to that of metals such as aluminum. A difference is Young's modulus for silicon and polysilicon as compared to aluminum also appear to be relevant.

Figure 11:
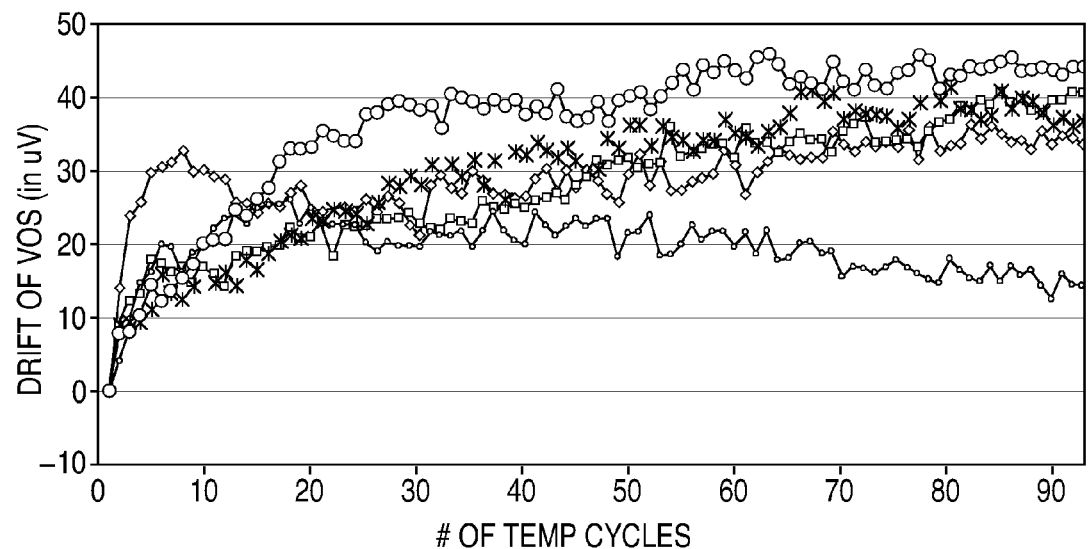
FIG. 11 is a diagram illustrating the drift in input offset voltage Vos for prior art differential transistor input amplifiers with respect to a number of temperature cycles.
Figure 12:
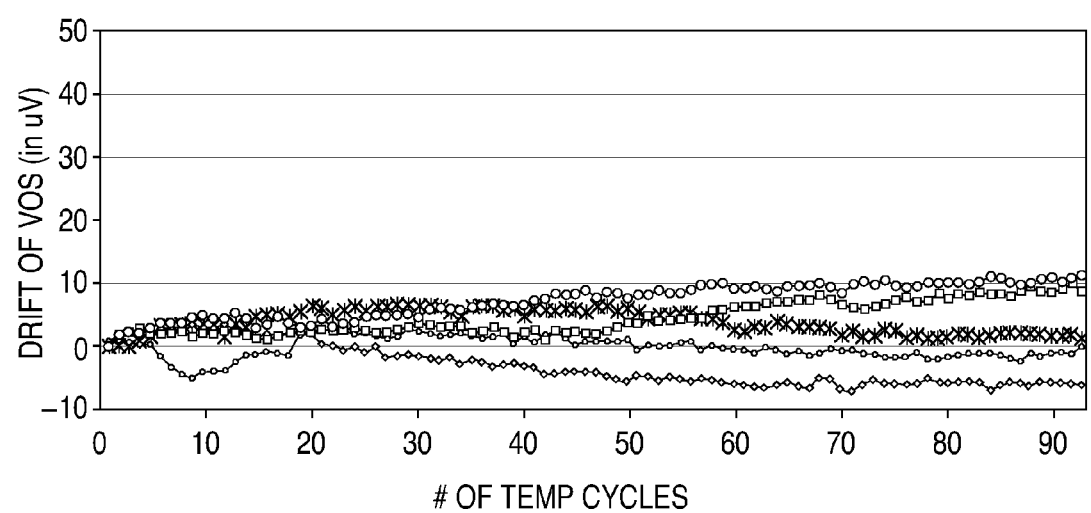
FIG. 12 is a diagram illustrating the drift in input offset voltage Vos for differential transistor input amplifiers in accordance with one embodiment of the present invention with respect to a number of temperature cycles.

FIG. 11 shows a sample taken from five operational amplifiers incorporating prior art differential transistor pairs where the metal emitter contacts are disposed over the emitter regions as depicted in FIGS. 3 and 5. The change or drift in input offset voltage Vos increases substantially after about 80 cycles up to values ranging from about +15 to +45 μV. FIG. 12 depicts another sample taken from five operation amplifiers using differential transistor pairs in accordance with one embodiment of the present invention where the metal emitter contacts are displaced away from the emitter regions as depicted in FIGS. 6 and 7. As can be seen, the drift in input offset voltage Vos only ranges between +10 to −6 μV after about 80 cycles, a decided improvement.

Figure 13:
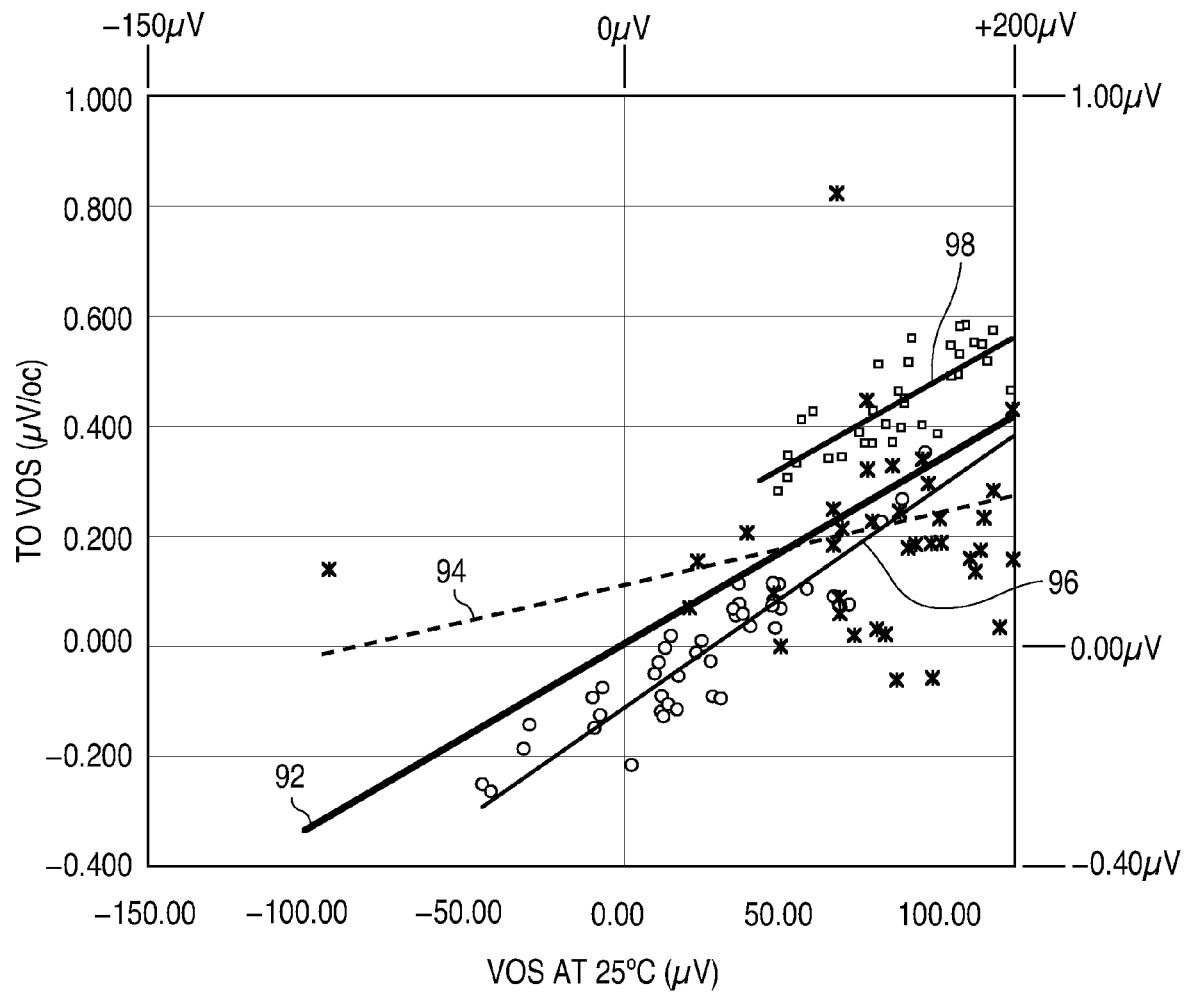
FIG. 13 is a diagram illustrating the temperature coefficient of the input offset voltage of prior art differential transistor input amplifiers and of differential transistor input amplifiers in accordance with one embodiment of the present invention.

FIG. 13 depicts the temperature coefficients of the input offset voltage Vos (TCVos in μV/° C.) of five different operational amplifiers. The vertical scale for TCVos ranges from −0.40 to +1.00 μV/° C. and the horizontal scale for Vos ranges from −150 to +200 μV at 25° C. The data points associated with line 92 represent the ideal case for the tempco of Vos. The data points for line 94 represents the tempco for amplifiers utilizing conventional differential transistor pairs as depicted in FIGS. 3 and 5. The data points for lines 96 and 98 represent the tempco for amplifiers utilizing differential transistor pairs in accordance with one embodiment of the present invention as depicted in FIGS. 6 and 7. Note that the slope of the tempcos represented by lines 96 and 98 are much closer to that of the ideal slope of line 92 as compared to the prior art represented by the slope of line 94. This data indicates that the differential transistor pairs of FIGS. 6 and 7 have more predictable characteristics that more closely follow ideal transistor characteristics.

Figure 8A:
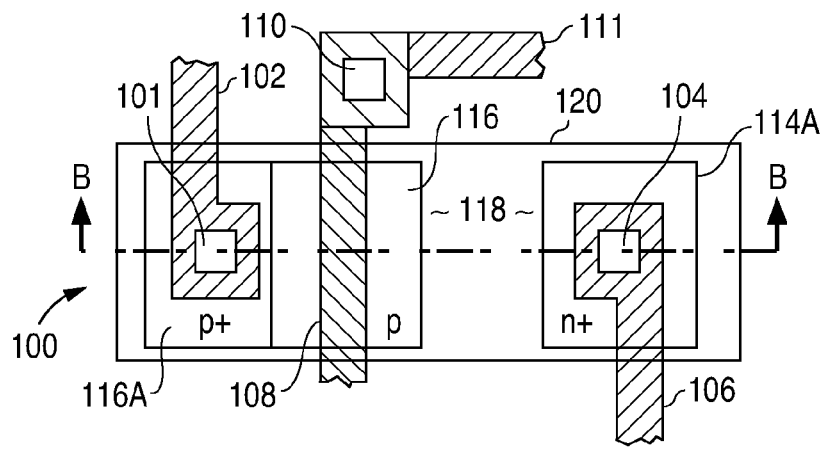
FIG. 8A is a plan view of another prior art bipolar transistor.
Figure 8B:
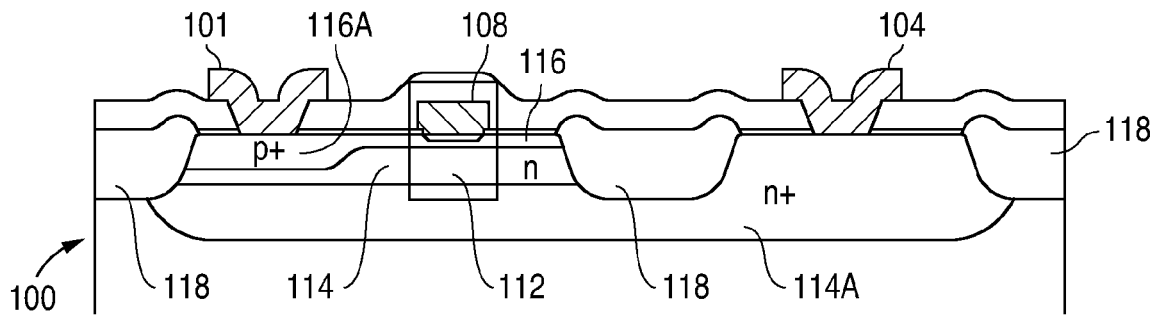
FIG. 8B is a side view of the FIG. 8A prior art transistor taken though section line B-B of FIG. 8A.
Figure 9A:
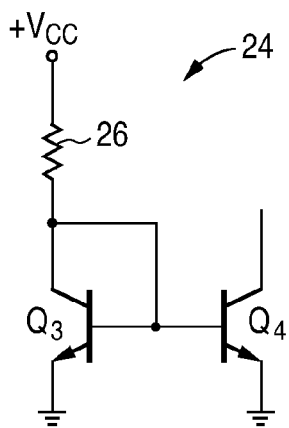
FIGS. 9A and 9B are schematic diagrams of prior art current mirror circuits.
Figure 9B:
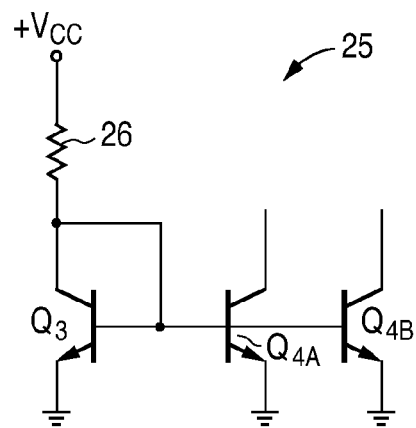
Figure 10A:
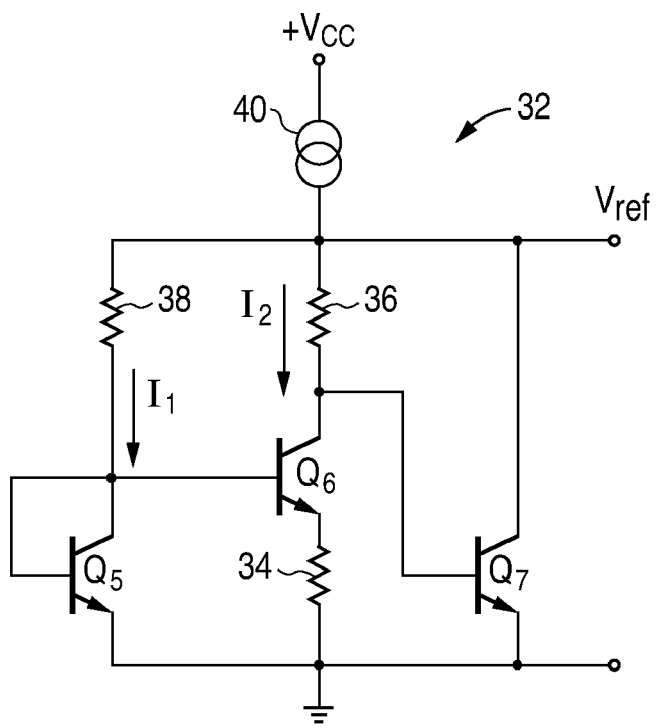
FIGS. 10A, 10B and 10C are various configurations of prior art voltage reference circuits.
Figure 10B:
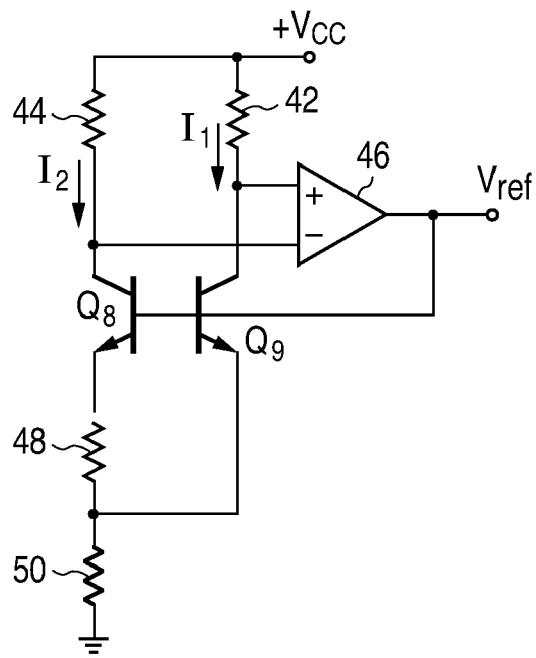
Figure 10C:
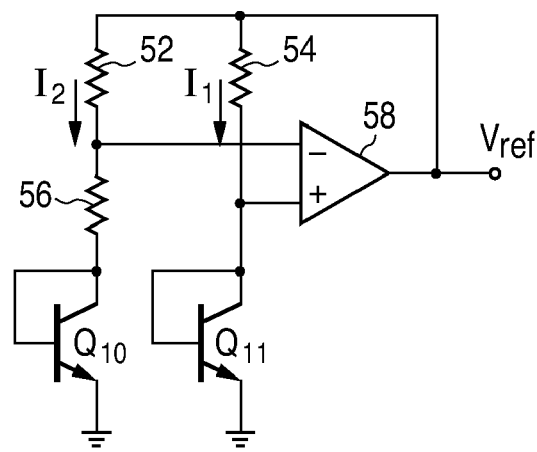

FIGS. 8A and 8B depict another prior art poly emitter bipolar transistor 100. Transistor 100 includes a metal base contact 101 and an associated metal interconnect 102 and a metal collector contact 104 and an associated metal interconnect 106. Box 112 of FIG. 8B indicates the intrinsic NPN transistor which includes an N+ emitter region (not designated) disposed below the doped poly emitter contact 108, a N type collector region 114 and an associated N+ collector buried layer region 114A. A thin P type base region 116 is disposed intermediate the emitter and collector regions together with the P+ base contact region 116A. As can best be seen in FIG. 8A, box 120 indicates the edges of the buried N+ layer, with the box defining the active region of the transistor. The poly emitter contact 108 extends away from the emitter region to an area outside the active region 120 where it is contacted by a metal contact 110. Metal contact 110 connects the poly emitter contact 108 to the emitter metal interconnect 111.

It can be seen that, unlike the transistors of FIG. 5 by way of example, the metal emitter contact 110 of transistor 100 is disposed well away from the emitter region. However, the objective of such placement, if any, is not apparent. The placement of the metal contact 100 outside the active region, with the resultant lengthy and somewhat resistive path from the contact and through the poly 108 to portions of the emitter, strongly suggests that transistor matching was not an objective. If anything, it is believed that the geometry of this emitter connection would lead one of ordinary skill to reject transistor 100 for transistor matching applications.

Thus, various embodiments of the present invention have been disclosed. Although these embodiments have been described in some detail, it should be understood that variations can be made by those skilled in the art without deviating from the spirit and scope of the present invention as defined by the appended claims.

What is claimed is:

1. Circuitry including:
    first and second transistors which form a transistor pair, with each of the transistors including base, emitter and collector regions and a doped polysilicon emitter contact together with a metal contact and a metal interconnect, with the metal interconnect making an electrical connection to the emitter region by way of the metal contact and the polysilicon emitter contact, and with the metal interconnect being displaced laterally away from the emitter region so that no part of the metal interconnect overlies any portion of the emitter region; and wherein the transistor pair form part of circuitry selected from the group consisting of (a) differential transistor pair circuitry, (b) current mirror transistor pair circuitry and (c) voltage reference transistor pair circuitry.

2. The circuitry of claim 1 wherein the first and second transistors each include an active region near the surface of the transistor and wherein the metal interconnect is disposed over the active region.

3. The circuitry of claim 2 wherein the base region of the first and second transistors each include a first portion intermediate the emitter and collector regions and a contiguous second portion not intermediate the emitter and collector regions and wherein the metal interconnect is disposed over the second portion of the base region.

4. The circuitry of claim 1 wherein the differential transistor pair circuitry includes a resistance connected intermediate the emitter regions of the first and second transistors.

5. The circuitry of claim 1 wherein the current mirror transistor pair circuitry is configured such that the first and second transistors have differing emitter areas.

6. The circuitry of claim 1 wherein the voltage reference transistor pair circuitry is configured such that one of the first and second transistors produces a base-emitter voltage from which negative tempco component is derived.

7. The circuitry of claim 6 wherein the voltage reference transistor pair circuitry is configured such that a ratio of current flow through the respective first and second transistors is controlled by an error amplifier.

8. The circuitry of claim 1 wherein the metal emitter contact is also displaced laterally away from the emitter region so that no part of the metal emitter contact overlies any portion of the emitter region.

9. The circuitry of claim 8 wherein the first and second transistors each include an active region near the surface of the transistor and wherein the metal interconnect is disposed over the active region.

10. The circuitry of claim 9 wherein the base region of the first and second transistors each include a first portion intermediate the emitter and collector regions and a contiguous second portion not intermediate the emitter and collector regions and wherein metal contact is disposed over the second portion of the base region.

11. The circuitry of claim 8 wherein the differential transistor pair circuitry includes a resistance connected intermediate the emitter regions of the first and second transistors.

12. The circuitry of claim 8 wherein the current mirror transistor pair circuitry is configured such that the first and second transistors have differing emitter areas.

13. The circuitry of claim 8 wherein the voltage reference transistor pair circuitry is configured such that one of the first and second transistors produces a base-emitter voltage from which negative tempco component is derived.

14. The circuitry of claim 13 wherein the voltage reference transistor pair circuitry is configured such that a ratio of current flow through the respective first and second transistors is controlled by an error amplifier.

\* \* \* \* \*